(12) United States Patent
Streppel et al.

(10) Patent No.: US 11,251,347 B2
(45) Date of Patent: Feb. 15, 2022

(54) SEMICONDUCTOR LIGHT SOURCE

(71) Applicant: OSRAM Opto Semiconductors GmbH, Regensburg (DE)

(72) Inventors: Ulrich Streppel, Regensburg (DE); Désirée Queren, Neutraubling (DE)

(73) Assignee: OSRAM OLED GmbH, Regensburg (DE)

( * ) Notice: Subject to any disclaimer, the term of this patent is extended or adjusted under 35 U.S.C. 154(b) by 13 days.

(21) Appl. No.: 16/609,374

(22) PCT Filed: May 30, 2018

(86) PCT No.: PCT/EP2018/064283
§ 371 (c)(1),
(2) Date: Oct. 29, 2019

(87) PCT Pub. No.: WO2018/220069
PCT Pub. Date: Dec. 6, 2018

(65) Prior Publication Data
US 2020/0083417 A1 Mar. 12, 2020

(30) Foreign Application Priority Data
Jun. 1, 2017 (DE) .......................... 102017112112.9

(51) Int. Cl.
*H01L 33/58* (2010.01)
*G03B 15/05* (2021.01)
*H01L 33/60* (2010.01)

(52) U.S. Cl.
CPC .............. *H01L 33/58* (2013.01); *G03B 15/05* (2013.01); *H01L 33/60* (2013.01); *G03B 2215/0503* (2013.01); *G03B 2215/0567* (2013.01)

(58) Field of Classification Search
CPC .......... H01L 33/58; H01L 33/62; G03B 5/05; G03B 2215/0503; G03B 2215/0567
(Continued)

(56) References Cited

U.S. PATENT DOCUMENTS 9,329,379 B2 5/2016 Jørgensen
10,422,509 B2 9/2019 Ebner
(Continued)

FOREIGN PATENT DOCUMENTS

CN 102687062 A 9/2012
CN 104296068 A 1/2015
(Continued)

OTHER PUBLICATIONS

The Second Office Action dated Jul. 21, 2021, of counterpart Chinese Application No. 201880036564.7, along with an English summary.
(Continued)

*Primary Examiner* — Dzung Tran
(74) *Attorney, Agent, or Firm* — DLA Piper LLP (US)

(57) ABSTRACT

A semiconductor light source includes at least one first emission unit, at least one second emission unit, and an optics, wherein the optical system has an inner region that converges radiation from the first emission unit, the optical system has an outer region that expands radiation from the second emission unit, a first light emission region of the inner region completely covers the first emission unit when viewed in plan view, and at least partially covers the second emission unit, a second light emission region of the outer region is partially or completely beside the second emission unit when viewed in plan view, and the inner region and the outer region have differently shaped light entry regions.

16 Claims, 11 Drawing Sheets

(58) Field of Classification Search
USPC .......................................................... 257/88
See application file for complete search history.

(56) References Cited

U.S. PATENT DOCUMENTS

| | | | |
|---|---|---|---|
| 10,480,748 B2 | 11/2019 | Streppel | |
| 2007/0085103 A1* | 4/2007 | Nishioka | H01L 33/60 257/99 |
| 2008/0068852 A1* | 3/2008 | Goihl | G02B 27/0944 362/509 |
| 2008/0239717 A1* | 10/2008 | Chen | G03B 21/208 362/231 |
| 2008/0310159 A1* | 12/2008 | Chinniah | F21S 43/315 362/244 |
| 2009/0296407 A1* | 12/2009 | Bailey | F21V 7/0091 362/309 |
| 2011/0317414 A1 | 12/2011 | Marfeld et al. | |
| 2012/0189291 A1* | 7/2012 | von Malm | G03B 15/05 396/157 |
| 2012/0320102 A1* | 12/2012 | Jorgensen | F21V 5/04 345/690 |
| 2014/0043830 A1 | 2/2014 | Popper et al. | |
| 2014/0133143 A1 | 5/2014 | Ebner | |
| 2016/0138777 A1 | 5/2016 | Shen et al. | |
| 2017/0059120 A1 | 3/2017 | Kataoka | |

FOREIGN PATENT DOCUMENTS

| | | |
|---|---|---|
| DE | 10 2009 017 495 | 8/2010 |
| DE | 10 2011 078 287 | 1/2013 |
| DE | 10 2013 226 970 | 6/2015 |
| DE | 10 2016 115 757 | 3/2017 |
| WO | 2011/039052 | 4/2011 |
| WO | 2015/007597 | 1/2015 |
| WO | 2016/180814 | 11/2016 |

OTHER PUBLICATIONS

The Third Office Action dated Dec. 2, 2021, of counterpart Chinese Application No. 201880036564.7, along with an English translation.

* cited by examiner

SEMICONDUCTOR LIGHT SOURCE

TECHNICAL FIELD

This disclosure relates to a semiconductor light source.

BACKGROUND

WO 2011/039052 A1 concerns a lighting device for a camera and a method of operating such a lighting device. There is nonetheless a need to provide a semiconductor light source that can be used as a flashlight under varying ambient light conditions.

SUMMARY

We provide a semiconductor light source including at least one first emission unit, at least one second emission unit, and an optics, wherein the optical system has an inner region that converges radiation from the first emission unit, the optical system has an outer region that expands radiation from the second emission unit, a first light emission region of the inner region completely covers the first emission unit when viewed in plan view, and at least partially covers the second emission unit, a second light emission region of the outer region is partially or completely beside the second emission unit when viewed in plan view, and the inner region and the outer region have differently shaped light entry regions.

We also provide a semiconductor light source including at least one first emission unit, at least one second emission unit, and an optics, wherein the optical system has an inner region that converges radiation from the first emission unit, the optical system has an outer region that expands radiation from the second emission unit, a first light emission region of the inner region completely covers the first emission unit when viewed in plan view, and at least partially covers the second emission unit, a second light emission region of the outer region is partially or completely beside the second emission unit when viewed in plan view, the inner region and the outer region have differently shaped light entry regions, the second emission unit extends all around the first emission unit when viewed in plan view, and both emission units are configured to emit light of the same color locus.

LIST OF REFERENCE SYMBOLS 1 semiconductor light source
11 optical axis
21 first emission unit
22 second emission unit
3 optics
30 mounting side
31 inner region
32 outer region
33 light input region
41 first light emission region
42 second light emission region
43 interior side
44 exterior side
45 joint area
51 first light entry region
52 second light entry region
55 scatter lens
61 mirror
62 reflector housing
63 inner wall
64 reflector base area
7 portable image recording device
71 first camera sensor
72 second camera sensor
73 display
8 carrier
A. angles
B width of emission units taken together
D distance to optical axis in mm, in 1 m distance
Ev illuminance in arbitrary units (a.u.)
H1 height of optics
H2 height of reflector housing
H3 height of first light emission region
H4 height of optics together with emission units
R radius of curvature of the first light emission region
S. beam path
T correlated color temperature in K
W width of reflector base area

DETAILED DESCRIPTION

The semiconductor light source may comprise one or more first emission units. The at least one first emission unit is formed, for example, by one or more LED chips or by a pixelated LED chip. Preferably, at least one first emission unit is configured to produce visible light, in particular white light. The first emission unit is preferably operated in pulsed mode, i.e. it emits only in relatively short time ranges, but can also be used for continuous wave lighting.

The semiconductor light source may comprise one or more second emission units. The at least one second emission unit may be configured to produce visible light, in particular white light. The second emission unit is preferably operable electrically independent of the first emission unit.

Preferably, both emission units emit light from the same color locus within the manufacturing tolerances. Different first emission units can emit light of different colors from each other, in particular different white tones, accordingly different second emission units can produce light of different color locus from each other. If several first and several second emission units are present, first and second emission units assigned to each other preferably generate light of the same color locus. A first and a second emission unit emitting the same color can form a pair.

Alternatively, and less preferably, it is possible for the second emission unit to emit light with a different color locus during operation than for the first emission unit. For example, both emission units then emit white light, but with different color temperatures.

The semiconductor light source may comprise one or more optics. The preferably exactly one optics is configured to shape the beam of light emitted and generated by the first and second emission units. In particular, the optics is the only beam-shaping component of the semiconductor light source. The optics can be one-piece and/or monolithic.

Alternatively, the optical system is composed of several components, preferably closely connected to each other.

The optics may have an inner region. The inner region is configured to converge radiation. This means in particular that a divergence angle of the radiation can be reduced by the inner region compared to the radiation before passing through the optics. In particular, the inner region is configured to illuminate an area at a distance of at least 1 m or 2 m from the semiconductor light source and/or at most 8 m or 4 m from the semiconductor light source. The radiation generated during operation by the first emission unit can be shaped by the inner region.

The optics may have at least one outer region. The outer region(s) is/are preferentially configured for the expansion or scattering of radiation. This means that a divergence angle of the radiation can be increased by the optics. Alternatively, the divergence angle remains the same or approximately the same, but the direction of the radiation is changed by the outer region. In particular, the radiation generated by the second emission unit during operation is formed by the outer region.

The inner region of the optics may have a first light emission region. The first light emission region may be the entire light emitting surface of the inner region. The first light emission region can be formed by a continuous, gapless area.

The first light emission region may completely cover the first emission unit when viewed in plan view onto the semiconductor light source. Alternatively or additionally, the second emission unit is partially or completely covered by the first light emission region.

The outer region may have a second light emission region, in particular exactly one continuous second light emission region. The second light emission preferably forms all the light emitting surfaces of the outer region.

The second light emission region, seen in plan view, may be partially or completely beside the at least one second emission unit. This means that the second light emission range is preferably completely beside the first emission unit. Seen in plan view, the first light emission region and the second light emission region preferably do not overlap.

The inner and outer regions may have differently shaped light entry regions. A first light entrance area may be assigned to the inner region and a second light entrance area to the outer region. Seen in plan view, the two light entry regions preferably do not overlap. Differently shaped means in particular that the two light entry regions are not formed by a continuous, optically identically acting surface. In particular, the two light entry regions have different orientations and/or curvatures from each other.

The semiconductor light source may comprise at least a first emission unit, at least a second emission unit and an optics. The optics may have an inner area to converge radiation from the first emission unit and an outer area to expand or scatter radiation from the second emission unit. A first light emission region of the inner region may completely cover the first emission unit in plan view, and may at least partially cover the second emission unit. A second light emission region of the outer region may be partially or completely adjacent to the second emission unit when viewed in plan view. The interior and outer regions have differently shaped light entry regions.

Mobile image recording devices such as mobile phones often contain several camera sensors to capture images. The camera sensors may differ in particular with regard to their focal lengths and thus with regard to their sizes of a target window and a distance of the target window from the mobile phone. The object to be displayed is located in the target window. To be able to take photographs even under dark ambient light conditions, it is expedient to also adjust the flash light for the image recording device to the different distances and target window sizes. In addition, sensors with telephoto lenses, for example, have a lower sensitivity, which is why it is particularly advantageous to adjust the flash light. The sensor or camera sensor is formed by a two-dimensional CCD field, for example, to take pictures or films.

With the semiconductor light source described here, a flash light in particular can be set up especially for camera systems with two or more camera sensors installed. Different focus areas can be covered. Depending on which camera sensor is used, a selection of a specific illumination can be defined automatically or manually using the flash light, especially the semiconductor light source described here.

The optics, which is especially configured as a free-form lens with different shapes for inner region and outer region, allows a stronger focusing to be achieved, for example, by simultaneously adjusting the size of a light source, i.e. the size of a luminous surface of the emission units. This stronger focusing makes it possible, for example, to achieve a smaller area with higher luminance at a greater distance than with larger light sources. In addition, a separation of beam paths for the two emission units assigned to the inner region and outer region can be realized. This allows separate illumination of a center and corners of the target area. In addition, a more defined homogeneity of the illumination can be achieved, especially if both emission units are operated simultaneously.

So far, flash LEDs, with fixed chip sizes in combination mainly with Fresnel lenses have either been integrated directly into the LED component or used as secondary lenses. Variable beam angles can be achieved by using and superimposing two differently radiating flash modules. In this context, modules in particular mean two independent light sources, each with two different optics. In addition, camera systems can use optics that have at least one moving lens to change an overall focal length. Optics are also possible that have a lens that has a variable shape, for example, through a liquid-filled membrane. Examples of such optics can be liquid crystal based lenses, liquid phase membrane lenses or electro-wetted lenses.

The semiconductor light source offers in particular the possibility of changing the size of a light source and, in conjunction with the use of a suitable optics, of adapting the illumination of the target window to a selection of camera sensors used with regard to distance, size and/or luminance. No mechanically moving parts are required. Liquid-filled lenses and/or electrostatically controlled elements can also be dispensed with, thus increasing service life and vibration stability. Compared to liquid-filled lenses and/or mechanically moving parts, the semiconductor light source can be realized with reduced space requirements and in a compact, small design.

The outer region may completely or partially surround the inner region. This means that the outer region may be arranged around the inner region. The outer region is preferably clearly assigned to the second emission unit and/or the inner region is clearly assigned to the first emission unit. The light from the emission units can be treated differently from one another via the outer and inner regions. A combination of the two regions is still applicable.

The outer region and/or the inner region may be quadrant symmetrically shaped when viewed in plan view. This means that the four quadrants can be imaged into each other, especially by reflection on symmetry axes. The preferred symmetry axes are exactly two or exactly four, seen in plan view. In particular, the optics are square or rectangular rather than circular when viewed in plan view.

The second emission unit may completely or partially extend around the first emission unit in plan view. In other words, the second emission unit can surround and/or enclose the first emission unit in plan view. Preferred is a total area of the second emission unit larger than a total area of the first emission unit, for example, by at least a factor of 1.5 or 2 and/or by not more than a factor of 4 or 3.

The light emission region may be shaped as a converging lens. It is not absolutely necessary for the first light emission region to be spherically shaped. The collecting lens, which forms the first light emission region, can be a free-form lens.

The first light emission region and the second light emission region may be separated from each other by a kink in cross section. This applies in particular to a cross section through an optical axis of the optics. Alternatively or additionally, the two light entry regions are separated from each other by a kink. The term kink does not exclude the possibility of a rounding in the area of the kink having a small radius of curvature. Such roundings can be caused, for example, by a manufacturing process of the optics such as when the optics is manufactured by injection molding or transfer molding.

The first light entry region may be formed in places or completely planar. This means that the first light entry region may have no or no significant curvature. In this example, the first light entry region is preferably oriented perpendicular or approximately perpendicular to the optical axis. As for angles, approximately means a maximum tolerance of 15° or 10° or 50°.

The second light entry region of the outer region may be prismatically shaped, especially when viewed in a cross section through the optical axis. This means, for example, that the light entry region is composed of one or more flat surfaces that can be aligned obliquely to the optical axis. The second light entry region can, for example, be shaped like an envelope of a cone.

The second light entry region may be formed partially or completely in cross section by a surface inclined towards the first emission unit. This allows the radiation of the second emission unit to be refractively deflected away from the first emission unit, i.e. by refraction. This means that the light from the second emission unit may be guided away from the first emission unit.

The second light emission region, seen in cross section, for example, through the optical axis, may be formed as a triangle. This means, for example, that in the direction away from the second emission unit and/or a mounting side of the optics, the second light emission region tapers.

An interior side of the second light emission region, which is closer to the first emission unit and thus closer to the optical axis, may be configured for total reflection of radiation from the second emission unit. Alternatively or additionally, an exterior side opposite the interior side and thus further away from the optical axis and/or the emission units is arranged to refract radiation from the second emission unit. The refraction of light is preferred towards the optical axis.

The triangle forming the second light emission region may have a rounded tip. A rounded tip can result from the manufacturing process, in particular injection molding or transfer molding. When viewed in plan view, the rounded tip at the second light emission region preferably makes up a surface proportion of not more than 10% or 20%.

The two light emission regions may be flush with each other in the direction away from the emission units and/or in the direction away from the mounting side. This means that the two light emission regions have the same height, seen along the optical axis and/or related to the mounting side of the optics.

The optics may have a trapezoidal light entry region seen in cross section, especially through the optical axis. One floor surface of the light entry region preferably faces the first emission unit. The floor surface can form the first light entry region. In particular, the floor area may be congruent or approximately congruent with the first emission unit.

Side surfaces of the light entry region may be provided with a mirror. The mirror may be configured to reflect radiation from both the first and second emission units. The radiation of the first emission unit may be reflected preferably within the light input region and the radiation of the second emission unit may be reflected outside the light input region. The side surfaces and the mirror are preferably straight in cross section. The mirror reflects specularly preferably on both sides and can be formed by a metal coating.

The second light emission region may be formed by several diffusing lenses. In plan view, the scattering lenses are preferably densely packed and arranged to fill the entire surface or almost the entire surface. In particular, the scattering lenses are arranged in a hexagonal or square or rectangular pattern. The scattered lenses are preferably comparatively small collection lenses. The scattering lenses can be of the same shape as each other. If the first light emission region is shaped as a converging lens, the diverging lenses shall preferably have an average diameter of not more than 20% or 10% of an average diameter of the converging lens forming the first light emission region.

The diffusing lenses may partially or completely surround the first light emission region when viewed in plan view. This means that the first light emission region can be completely enclosed by the smaller diffusing lenses.

The semiconductor light source may comprise a reflector housing. The emission units may be located in the reflector housing. The light entry region is also preferably arranged in the reflector housing.

The inner walls of the reflector housing may be configured to reflect the radiation of the second emission unit. Radiation from the first emission unit preferably does not reach the inner walls or does not reach them to a significant extent. The inner walls can be curved so that the reflector housing widens towards the optics and along the optical axis at an increasingly slower rate.

The second light entry region may extend completely and/or evenly between the inner walls and the mirror. This means, for example, that the reflector housing is completely covered by the second light entry region together with the first light entry region. In a flat second light entry region, this is preferably oriented perpendicular to the optical axis of the optics.

Viewed in cross section, in particular through the optical axis, a quotient of a width of the emission units and a width of a reflector base area of the reflector housing may be at least 1 or 1.1 or 1.2, wherein the emission units are applied on the reflector base area. Alternatively or additionally, this quotient may be at most 1.7 or 1.5 or 1.3.

A quotient of the width of the emission units and a height of the reflector housing, seen in cross section in particular through the optical axis, may be at least 2.5 or 2.9 or 3.1. Alternatively or additionally, this quotient may be at most 4 or 3.5 or 3.3.

A quotient of the width of the emission units and a height of the first light emission region seen in cross section, in particular through the optical axis, may be at least 1.7 or 1.9 or 2.0. Alternatively or additionally, this quotient may be at most 2.5 or 2.3 or 2.2.

A quotient of the width of the emission units and a radius of curvature or mean radius of curvature of the first light emission region may be at least 1.5 or 2 or 2.2. Alternatively or additionally, this quotient may be at most 4 or 3 or 2.7.

The optics may be designed as multiple optics, in particular as double optics for several, in particular exactly two first and exactly two second emission units. The second light emission regions may be viewed in plan view and, taken together, are preferably configured in a shape of a figure eight so that the preferred two first light emission regions are separated from each other by the two second light emission regions and enclosed by the second light emission regions.

If there are more than two first light emission regions, the second light emission regions may frame the first light emission regions in the form of a grid, one of the first light emission regions being preferably located in each mesh of the resulting grid. In such an arrangement, it is particularly preferred that each first emission unit be assigned exactly one second emission unit in a one-to-one-correspondence. An optical axis of the optics is associated with each such pair of emission units, the emission units arranged in the pair preferably emitting light of the same color. This means in particular that each pair has its own inner region and its own outer region of the optics. The above examples of the optics and the emission units apply preferably to each pair of emission units.

There may be a first and a second emission unit intended for generation of white light with a correlated color temperature of at least 2700 K and/or at most 4500 K. Warm white light is produced by these emission units. Furthermore, two emission units are preferred for generation of white light with a correlated color temperature of at least 5000 K and/or at most 8000 K, i.e. for cold white light. The cold white emitting and the warm white emitting emission units are preferably designed as pairs so that emission units of the same color temperature are assigned to each other in the pair.

The semiconductor light source may be located as a flash in a portable image recording device. Accordingly, an image recording device with such a semiconductor light source is specified.

In the following, a semiconductor light source and a portable image recording device are explained in more detail with reference to the drawing using examples. Same reference symbols indicate the same elements in the individual figures. If marked, the representations are to be understood to scale.

Figure 1A:
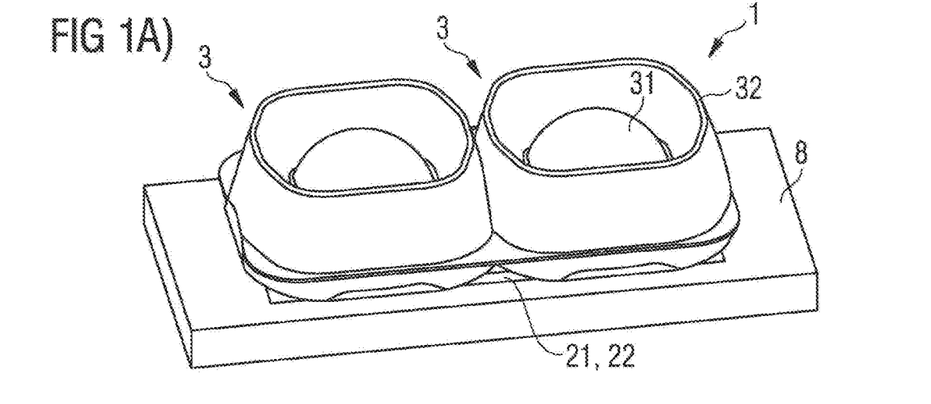
FIGS. 1A-1E, 2A-2B, 3A-3C, 6A-6D, 7A-7B and 8A-8B show schematic representations of examples of semiconductor light sources.
Figure 1B:
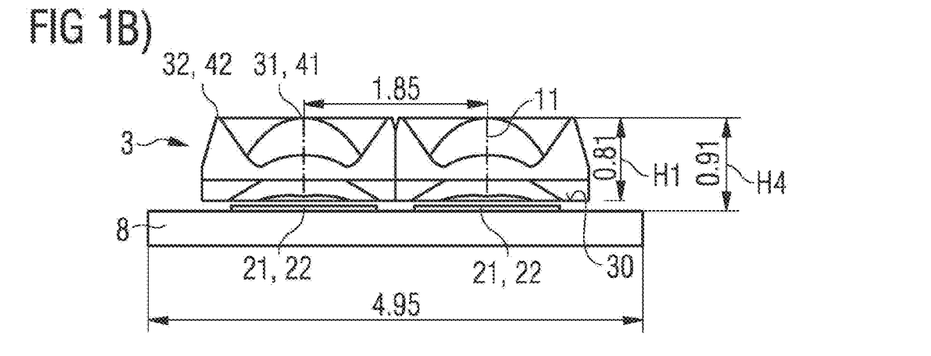
Figure 1C:
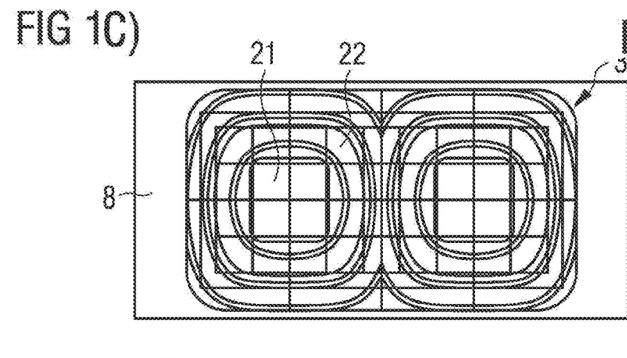
Figure 1D:
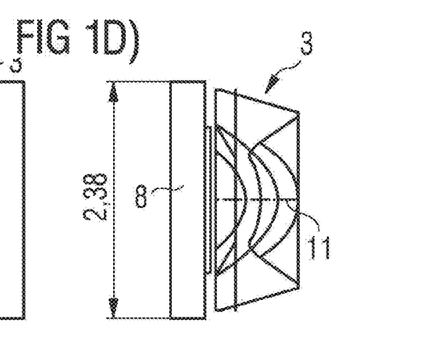

FIGS. 1A-1E show an example of a semiconductor light source 1. The perspective representation is in FIG. 1A, the section along a longitudinal axis in FIG. 1B, the plan view in FIG. 1C, the section along a transverse axis in FIG. 1D and the perspective representation of emission units 21, 22 in FIG. 1E. The FIGS. 1B, 1C and 1D are true to scale. Dimensions given as examples are given in millimeters.

Figure 1E:
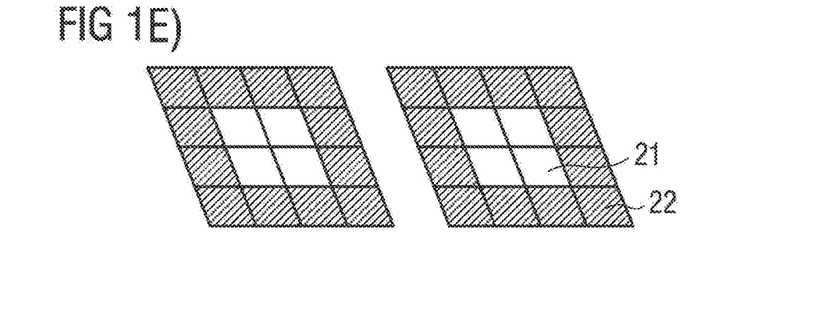

The semiconductor light source 1 comprises several emission units 21, 22, with inner first emission units 21 and outer framing second emission units 22 as shown in FIG. 1E. The emission units 21, 22 are arranged in pairs. Within a pair light of the same color is emitted. There is a pair for the generation of warm white light and a pair for the generation of cold white light. In the examples, there are two pairs in each of emission units 21, 22. Deviating from this, only a single pair or more than two pairs can be used in the semiconductor light source 1.

For example, each emission unit 21, 22 is formed by a single LED chip. The emission units 21, 22 can be subdivided into subregions. It is possible that not only the emission units 21 and 22 can be controlled separately, but also the subregions. Alternatively, the emission units 21, 22 are realized by a common LED chip that is pixelated. This means that certain pixels of this LED chip form the first emission unit 21 and other pixels form the framing second emission unit 22. The emission units 21, 22 can each be realized by only one pixel or by several pixels. The same applies to all other examples.

The emission units 21, 22 can be placed on a carrier 8. The carrier 8, for example, is a printed circuit board, or PCB for short.

Furthermore, the semiconductor light source 1 comprises an optics 3. For each pair of emission units 21, 22 an area of the optics 3 with its own optical axis 11 is provided. Thus, the pairs of emission units 21, 22 can be assigned to the units of Optics 3 in a one-to-one correspondence. The optics 3 is partly or completely produced by injection molding, for example. A material for optics 3 is polymethyl methacrylate, PMMA for short, a polycarbonate, PC for short, a silicone, an epoxy or a silicone-epoxy hybrid material.

The optics 3 has per unit an inner region 31 and a circumferential outer region 32. The inner region 31 is optically associated with the first emission unit 21 and the outer region 32 with the second emission unit 22, referred to each pair of emission units 21, 22. The inner region 31 has a first light emission region 41 and a first light entry region 51. Accordingly, the outer region 32 has a second light emission region 42 and a second light entry region 52. On one side facing the emission units 21, 22 there is a mounting side 30 of the optics 3. Deviating from the illustration in FIGS. 1B and 1D, the optics 3 with mounting side 30 can sit on the carrier 8. Through the inner region 31 and the outer region 32, a separation of beam paths from light of the inner first emission unit 21 and the outer second emission unit 22 is achievable.

For the optionally pixelated, inner first emission unit 21, an efficient collimation or convergence of light in a center of a target area is thus possible, whereby the target area is, for example, at a distance of 1 m from the semiconductor light source. This makes it possible to create a bright area or spot in the middle of the target area. A diameter or mean diameter of the first light emission region 41 designed as a collimator lens is preferably larger than the width of a luminous surface of the first emission unit 21. This allows an Etendue conservation to be realized approximately.

The second light emission region 42 of the outer region 32 is prismatically formed to deflect beam bundles outwards so that the collimator lens of the first light emission region 41 has sufficient space. Surfaces of the resulting prism ring of the second light emission region 42 are shaped such that light is also directed into the corners of the target region, preferably for all or approximately all beam paths, and not into the center of the target region.

If both emission units 21, 22 per pair are switched on, their radiation is superimposed in the target range such that a high homogeneity is achieved.

The dimensions given in FIGS. 1B to 1D and the resulting relative ratios to each other shall preferably apply with a tolerance of not more than a factor of 1.25 or 1.5 or 2.

A total height H4 of the optics 3 together with the emission units 21, 22, for example, is only about 10% greater than a total height H1 of the optics 3 alone. The height H1 of the optic 3 is preferably not more than 50% of a distance between adjacent optical axes 11 along the longitudinal direction as shown in FIG. 1B.

Seen in plan view, the emission units 21, 22 are square or shaped as a square ring. Accordingly, the optics 3 per unit has a quadrant symmetry. Thus the optics 3 is seen in plan view as shown in FIG. 1C, rather square than round.

Figure 2A:
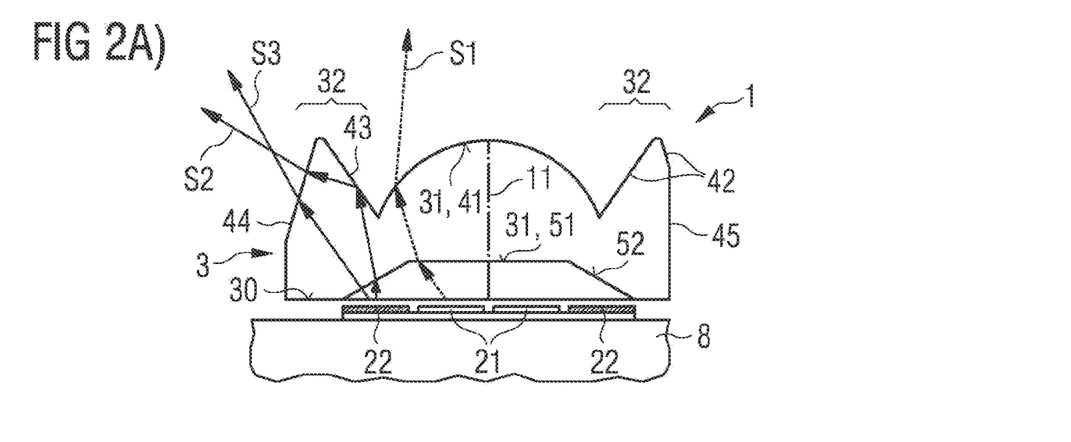

In the schematic sectional views of FIGS. 2A-2B and 3A-3C, various beam paths and geometric parameters of the optics 3 of the semiconductor light source 1 are shown in more detail. In FIG. 2A, a first beam path S1 is shown, which refers to the inner region 31. From the first emission unit 21, the beam path S1 runs to the first light entry region 51, where it is refracted. A second refraction takes place at the first light emission region 41, again in a direction toward the optical axis 11.

The two beampaths S2, S3 are two different types of beam paths for the outer region 32. For the second beam path S2 a light refraction away from the optical axis 11 occurs at the flat second light entry region 52, which is planar and straight in cross section and arranged obliquely to the optical axis 11. TA total reflection away from the optical axis 11 occurs at an interior side 43 of the second light emission region 42 and a comparatively slight light refraction occurs at an exterior side 44 of the second light emission region 42.

On the other hand, the third beam path S3 is refracted at the second light entry region 52 and at the exterior side 44. In total, light from the associated second emission unit 22 expands via the outer region 32. At a point opposite the mounting side 30, the outer region 32 has a slight rounding. This rounding does not significantly contribute to beam shaping.

Figure 2B:
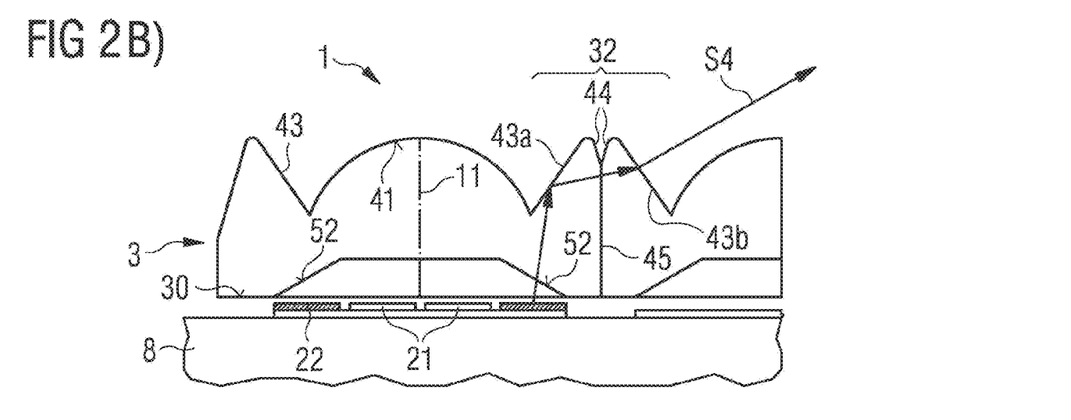

In FIG. 2B, a fourth beam path S4 extending over two adjacent units of the optics 3 is shown. The two units of optic 3 collide in a joint area 45. In FIG. 2B, the joint area 45 is symbolized as a solid line, but the joint area 45 does not necessarily correspond to a phase transition or a material boundary so that the joint area 45 can only be a fictitious subdivision within the optics as also shown FIG. 1A.

For the fourth beam path S4, a refraction occurs at the second light entry region 52 and a total reflection at the corresponding interior side 43a. This directs the radiation into the adjacent unit of the optics 3 and refracts and decouples it at the interior side 43b of the other unit. This arrangement allows a distance between two adjacent optical axes 11 to be reduced so that an effective width of the optical 3 units in the longitudinal direction is smaller than a width in the transverse direction as shown in FIGS. 1B and 1D. In an area facing away from the mounting side 30 above the joint area 45, the two exterior sides 44 are present. The exterior sides 44 extend about one third along the optical axes 11, referred to a height of the first light emission region 41, which is designed as a convergent lens.

Figure 3A:
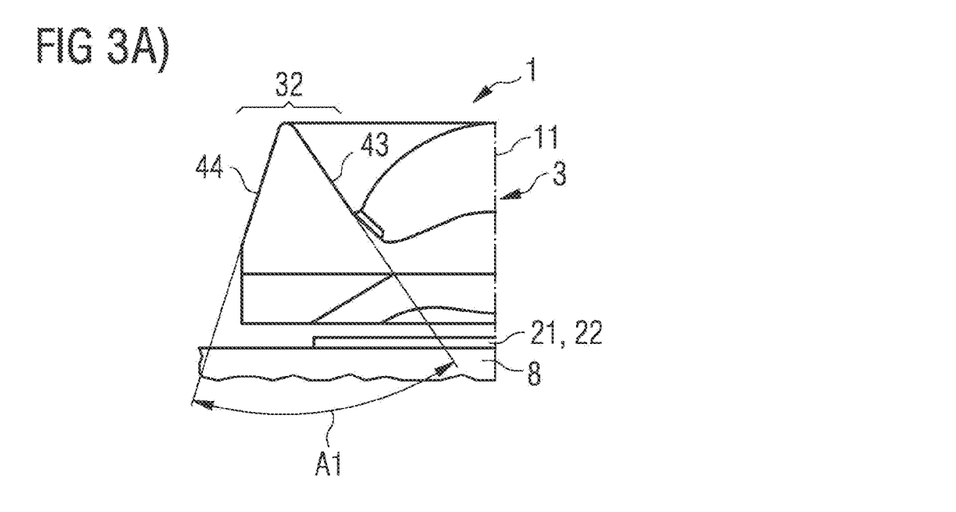
Figure 3B:
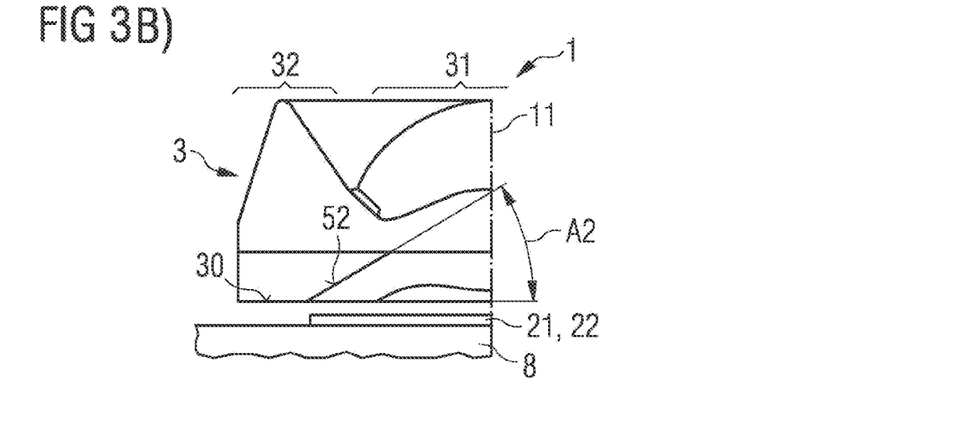

As can be seen from FIG. 3A, an angle A1 between the interior sides 43 and the exterior sides 44 in a section through the optical axis 11 is preferably at least 45 and/or at most 60°, preferably about 52°. According to FIG. 3B, an angle A2 between the mounting side 30 and the second light entry region 52 in a section through the optical axis 11 is preferably at least 20° and/or 40°, especially at 30°. The data for the angles A1, A2 can change in the course of the prism ring, which forms the outer region 32, i.e. the angles A1, A2 can have different values in different sections.

Figure 3C:
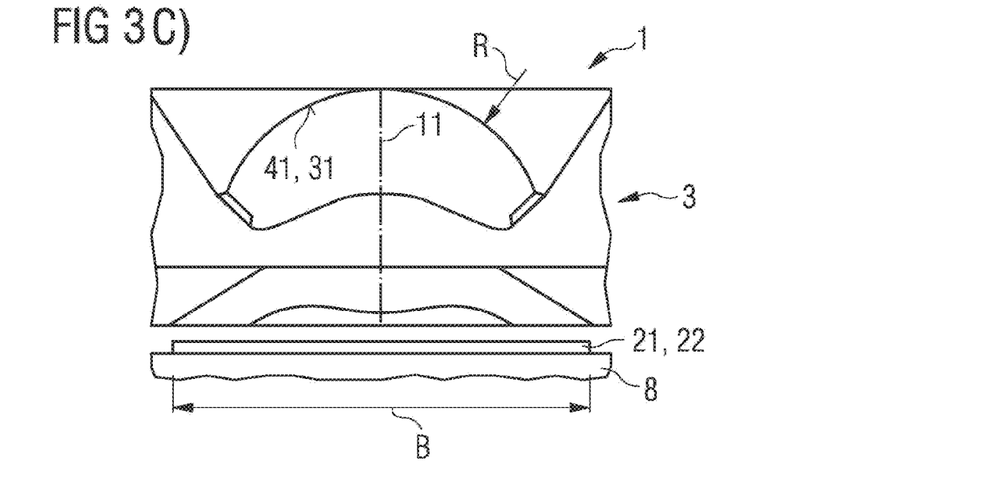

In FIG. 3C, it is shown that the first light emission region 41 is spherically shaped in cross section as seen through the optical axis 11, for example, with a radius of curvature of at least 0.4 mm and/or at most 0.8 mm, in particular approximately 0.6 mm. A ratio of a width B of the emission units 21, 22 and the radius of curvature R of the first light emission region 41 is preferably at least 2 and/or at most 3, in particular approximately 2.4. As an alternative to the representation in FIG. 3C, the converging lens of the first light emission region 41 may also be of aspherical design, for example, as an xy polynomial or as a free form.

FIGS. 4A-4B and 5A-5B as well as 9A-9B and 10A-10B each illustrate a radiation characteristic of the semiconductor light source 1 as a function of a distance D to the optical axis 11. The figure parts A each refer to the case that both emission units 21, 22 are switched on. In parts B of the figures only the corresponding first emission unit 21 is switched on. An illuminance EV in arbitrary units and a correlated color temperature T in K are plotted. The representations refer to a plane perpendicular to the optical axis, 1 m away from the semiconductor light source 1.

Figure 4A:
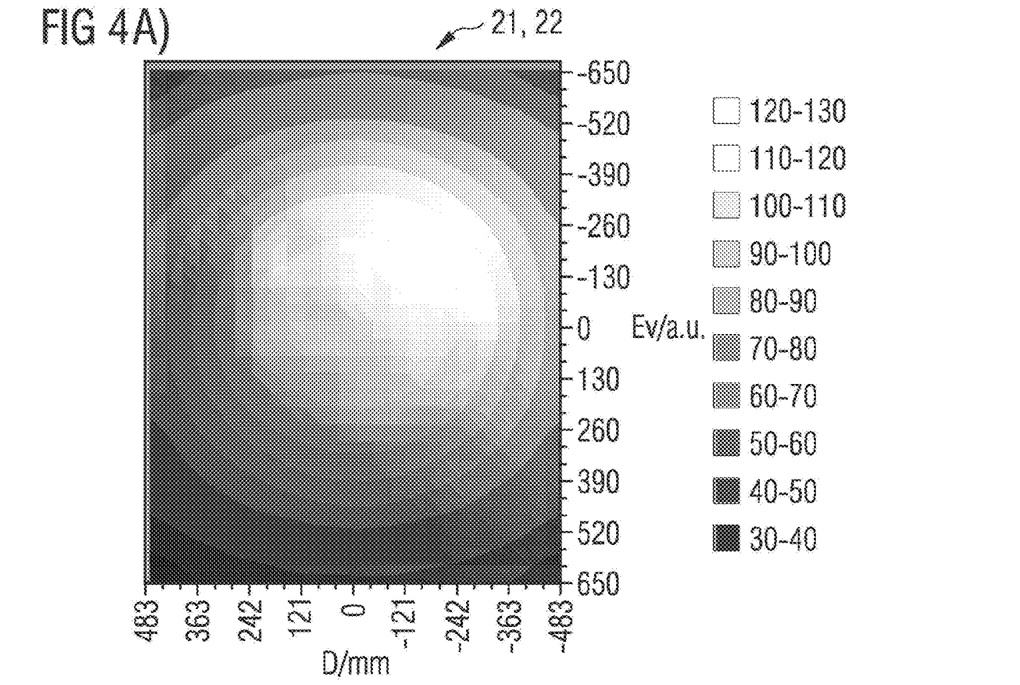
FIGS. 4A-4B, 5A-5B, 9A-9B and 10A-10B show schematic representations of optical characteristics of semiconductor light sources.
Figure 4B:
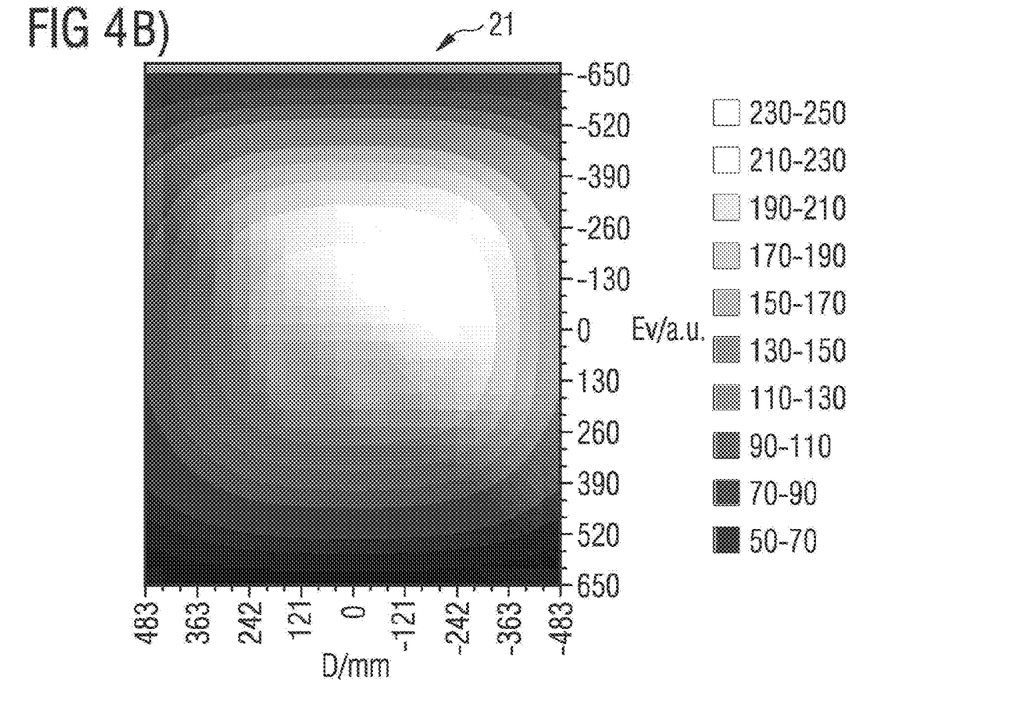
Figure 5A:
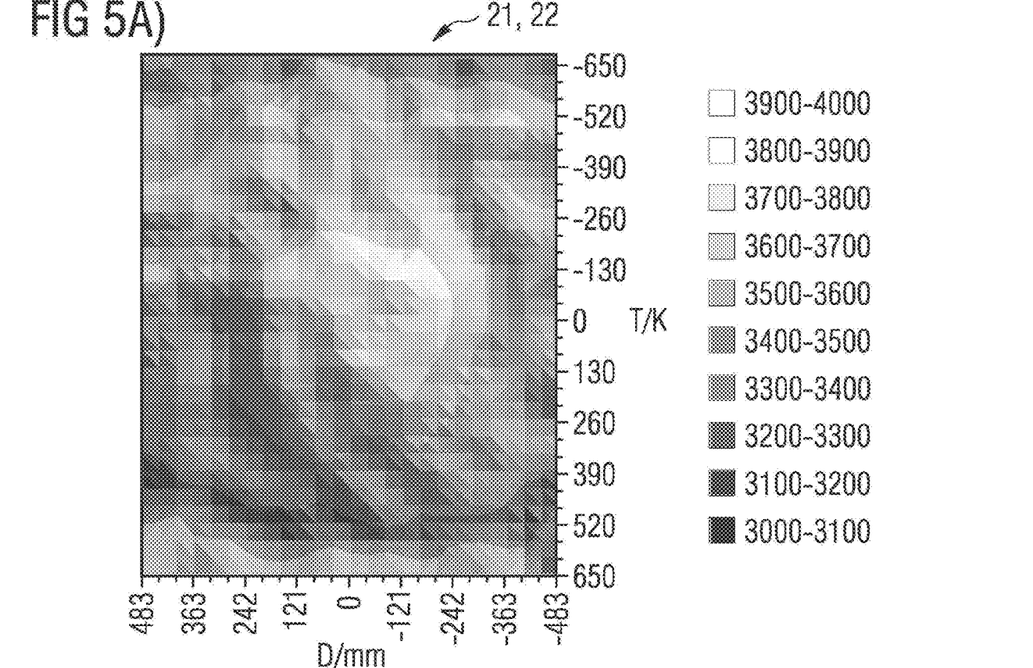
Figure 5B:
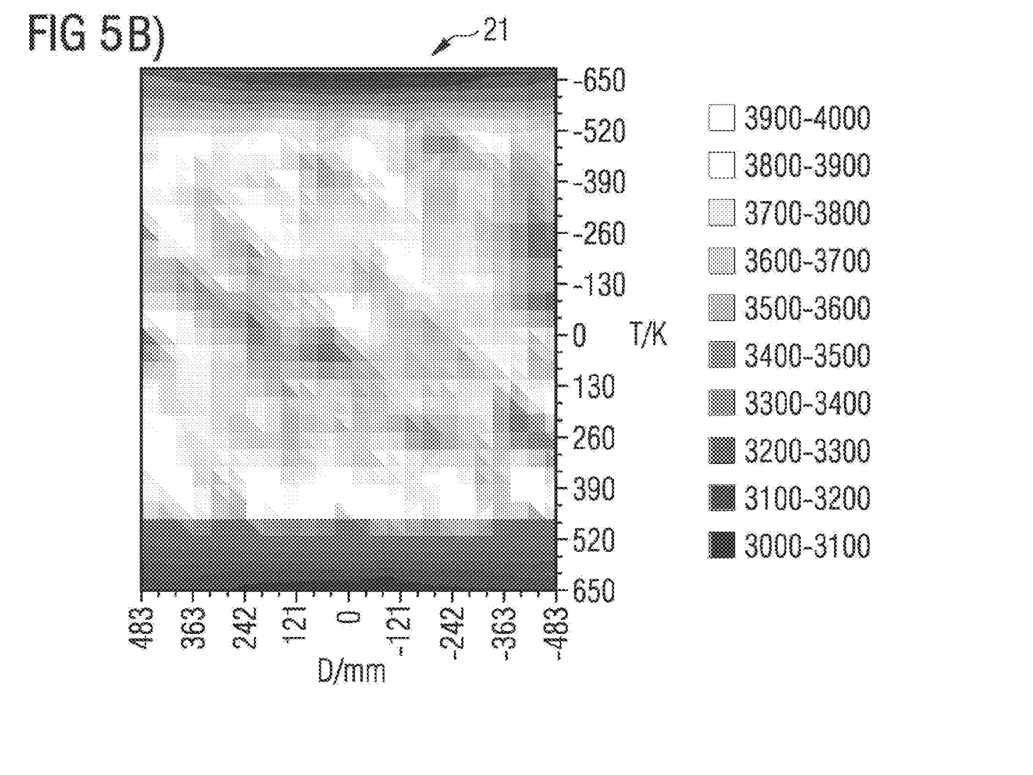
Figure 6A:
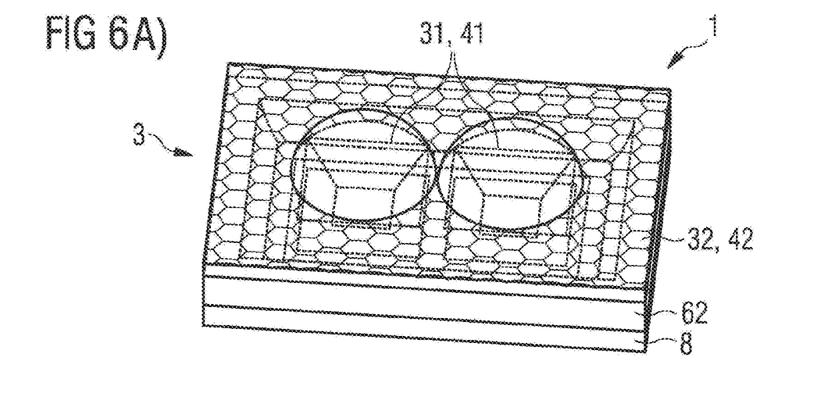
Figure 6B:
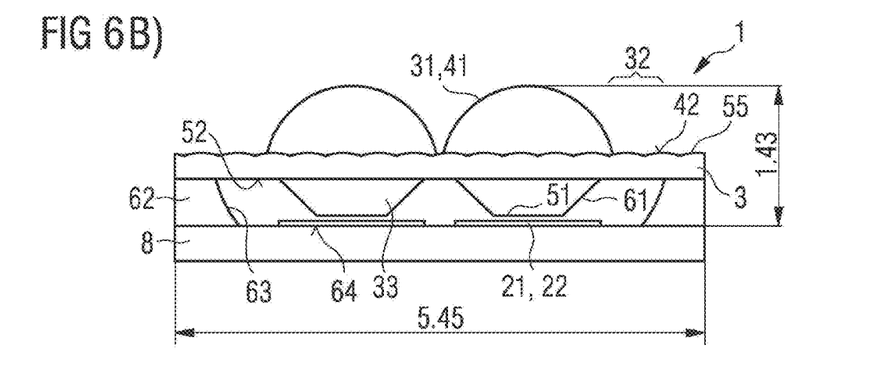
Figures 6C, 6D:
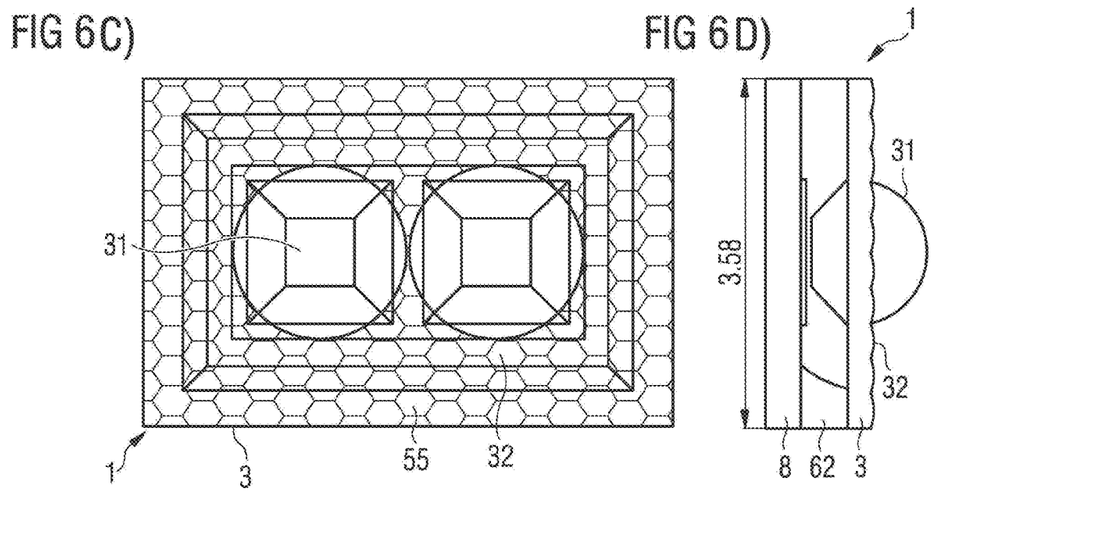

It can be seen from FIGS. 4A and 4B that uniform illuminance can be achieved over a large area. Furthermore, as shown in FIGS. 5A and 5B, a homogeneous color temperature T can be achieved over a large area.

A further example of the semiconductor light source 1 is illustrated in FIGS. 6A-6D, analogous to FIGS. 1A-1E. Preferably, the emission units 21, 22 are used, as illustrated in FIG. 1E. Only the optics 3 differs from the example of FIGS. 1A-1E. The representation in FIGS. 6B to 6D is again true to scale.

The semiconductor light source 1 comprises a reflector housing 62, which is preferably located directly at the carrier 8. The reflector housing 62 preferably has specular or alternatively diffuse reflecting inner walls 63. The reflectivity of the inner walls 63 comes either from a material of the reflector housing 62 itself or from a non-drawn reflective coating such as a metal coating.

Within the reflector housing 62 there is a light input region 33, the side walls of which are equipped with a mirror 61. A floor area of the light input region 33 preferably lies congruently above the first emission unit 21 and not above the second emission unit 22. Seen in cross section, the light input region 33 is shaped like a symmetrical trapezoid and widens in the direction away from the emission units 21, 22.

The light input region 33 is formed in one piece with the inner region 31 and the outer region 32 and made of the same material. For example, the light input region 33, the inner region 31 and the outer region 32 are glued onto the reflector housing 62.

The second light entry region 52 of outer region 32 is flat and runs around the first light emission region 41 of inner region 31 shaped like a converging lens. The second light emission region 42 is formed by a large number of comparatively small scattering lenses 45 shaped like a converging lens.

This arrangement makes it possible to separate the beam paths of the emission units 21 and 22. The optics 3 is composed of two components, namely the translucent body with the mirror 61, the light entry regions 51, 52 and the light emission regions 41, 42 as well as the specular or diffusely reflecting reflector housing 62 with the inner wall 63. The translucent body closely connects to the reflector housing 62.

The emission units 21, 22 are mounted on a reflector base 64 of the reflector housing 62 and thus on the carrier 8. The carrier 8 and the reflector housing 62 can be formed in one piece, for example, as a QFN housing.

Figure 7A:
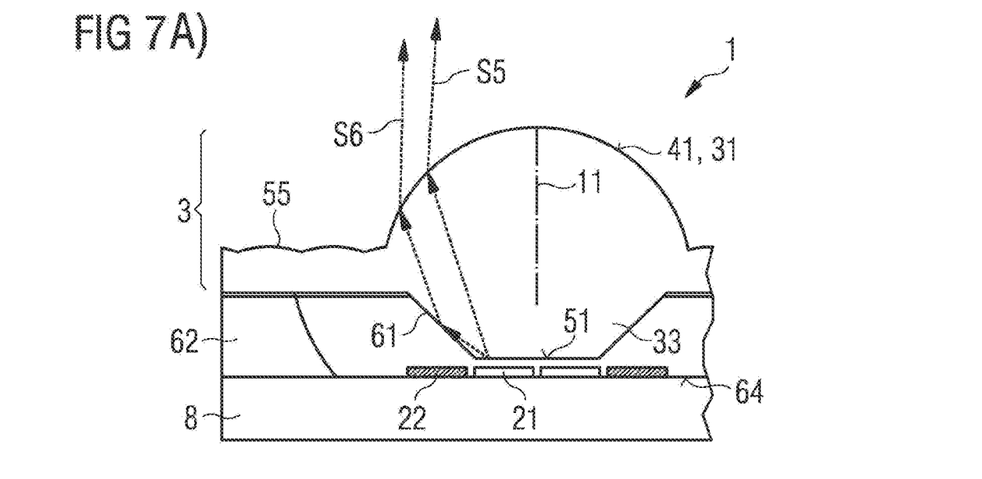
Figure 7B:
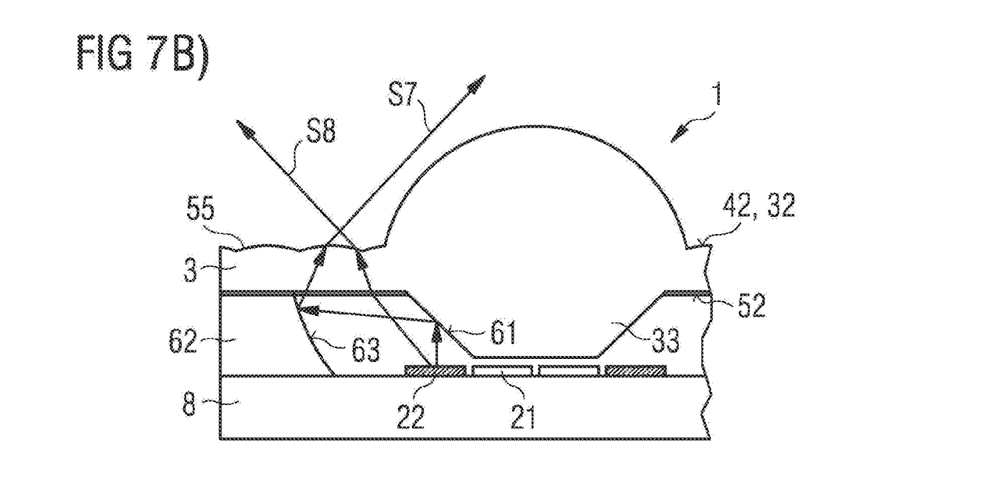

In the sectional views of FIGS. 7A-7B, several beam paths are shown as examples. For the beam path S5 in FIG. 7A, light from the first emission unit 21 enters the transparent body via the floor surface 51 and is directed toward the optical axis 11 without further refraction or reflection at the first light emission region 41. For beam path S6, an additional reflection takes place at the mirror 61 in the light input region 33, before light refraction towards the optical axis 11 takes place at the first light emission region 41.

FIG. 7B illustrates that for the beam path S7 a reflection takes place at the mirror 61 outside at the light input region 33, followed by a reflection at the inner wall 63 and a refraction at the second light entry region 52. In the beam path S8, a coupling takes place directly from the second emission unit 22 into the second light entry region 52. In both beam paths S7, S8 a diffuse beam widening and light distribution takes place via the scattering lenses 55.

Figure 8A:
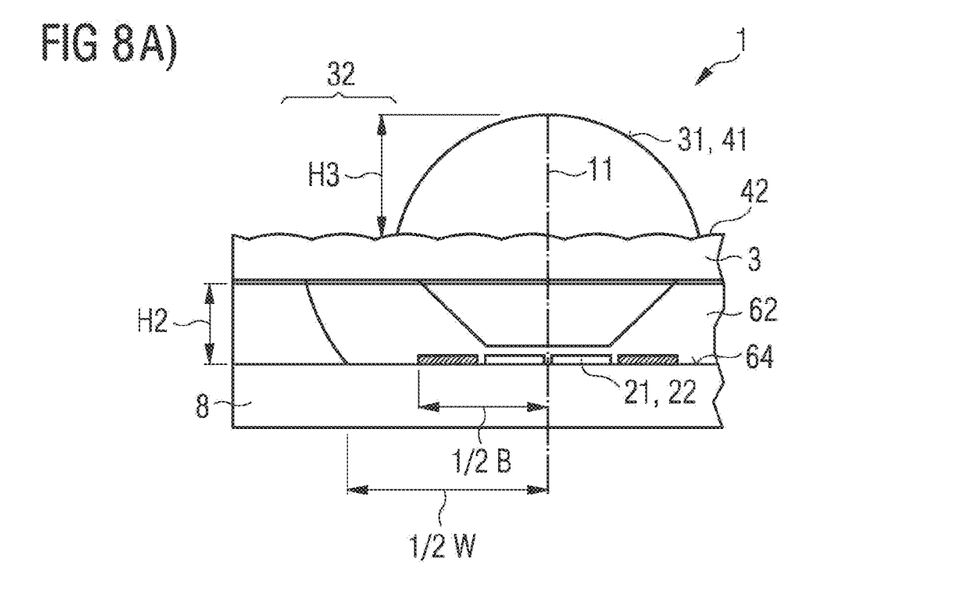

In the sectional view in FIG. 8A a ratio of a width B of the emission units 21, 22 and a width W of the reflector base 64 is 1.0 to 1.5, in particular approximately 1.25. A ratio of the width B of the emission units 21, 22 and a height H2 of the reflector housing 62 is preferably between 2.9 and 3.5, in particular about 3.2. Furthermore, a ratio of the width B of the emission units 21, 22 and a height H3 of the first light emission region 41 above the second light emission region 42 is 1.9 to 2.3, in particular about 2.1.

For example, half the width W of the reflector base area 64 is 1.17 mm, the reflector height H2 is 0.45 mm and the height H3 of the first light emission region 41 is 0.68 mm. For example, a radius of curvature of the scattering lens 55 shall be at least 0.2 mm and/or at most 0.6 mm, in particular 0.4 mm. Unless otherwise indicated, the values stated and the ratios derived therefrom shall preferably apply with a tolerance of no more than a factor of 1.5 or 1.25.

Figure 8B:
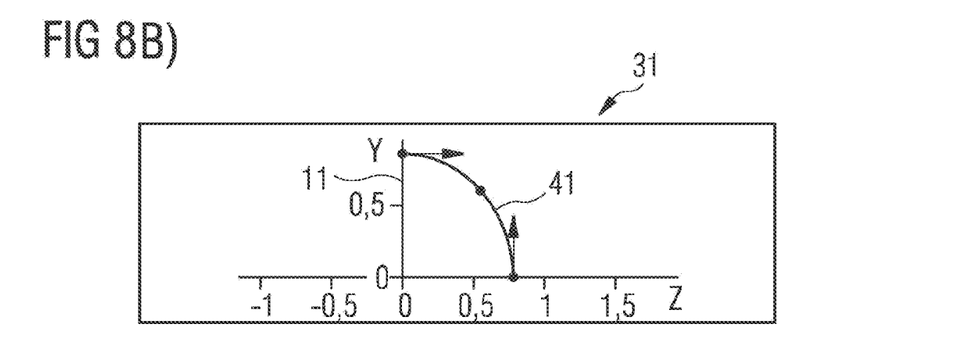
Figure 9A:
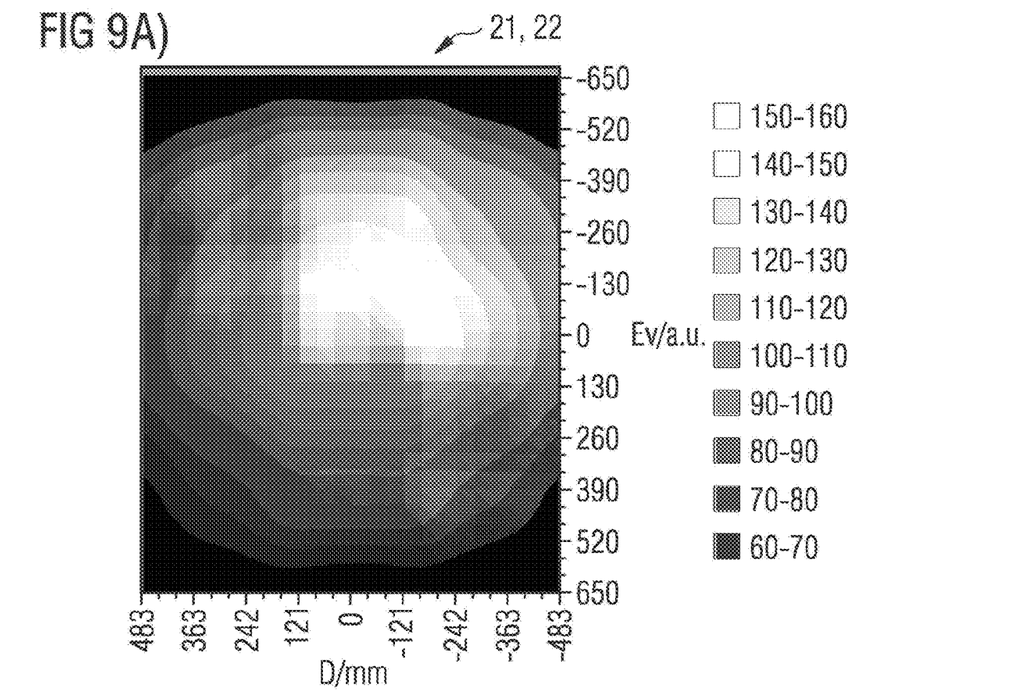
Figure 9B:
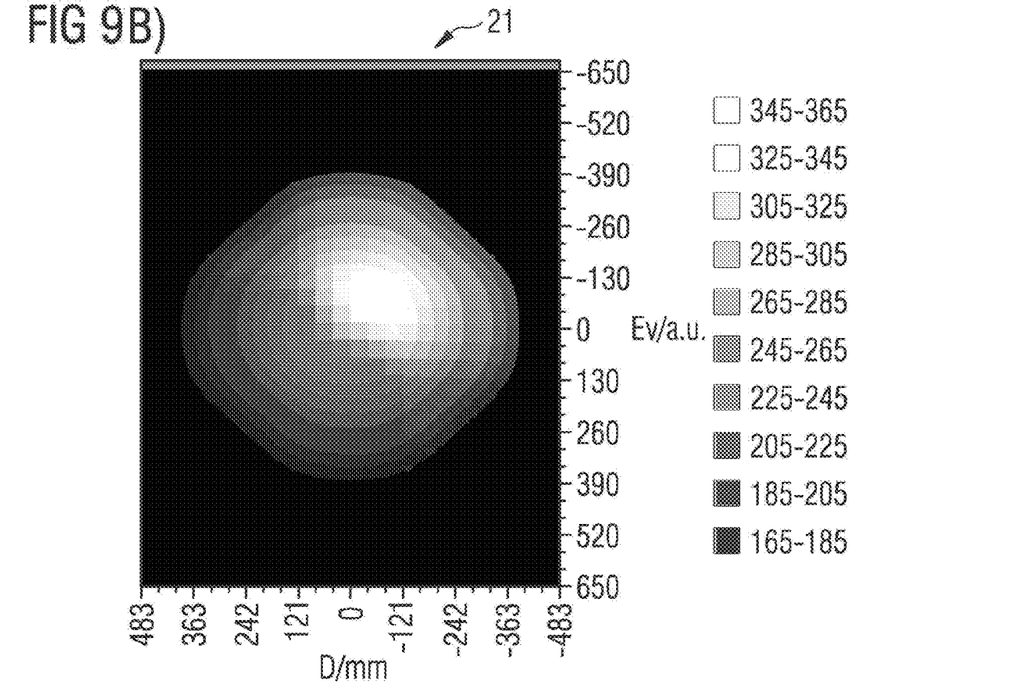
Figure 10A:
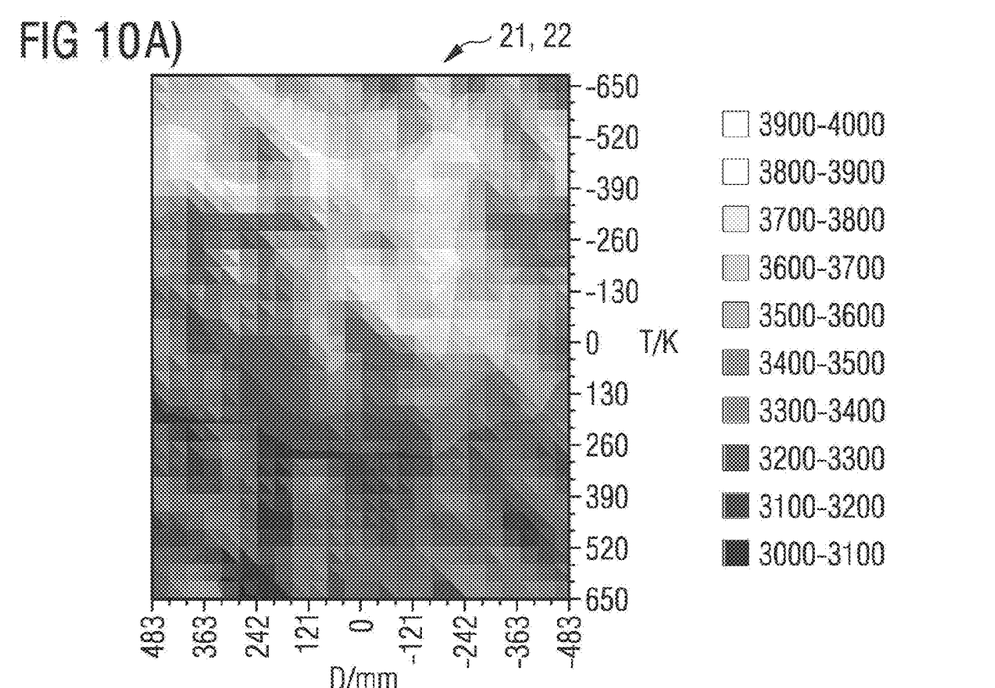
Figure 10B:
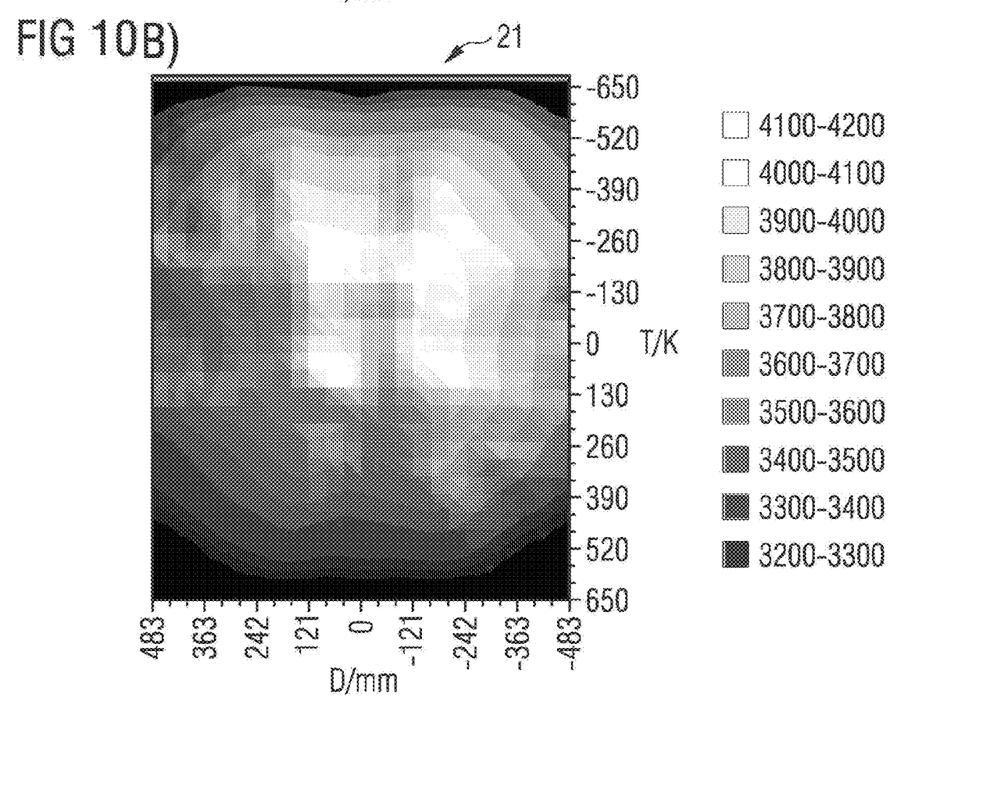

FIG. 8B illustrates that the lenticular first light emission region 41 is formed by a rotation of a guide curve about the optical axis 11. Such light emission regions 41 can be used for all examples. For example, the guide curve has the points with the coordinates 0; 0.885 and 0.55; 0.626 and 0.775; 0. In particular, a cubic spline fit is laid through these points. Optionally, the first light emission region 41 can also be anamorphic with different curvatures in x-direction and y-direction.

In FIGS. 9A-9B and 10A-10B representations analogous to FIGS. 4A-4B and 5A-5B are shown, but with reference to the example of FIGS. 6A-6D.

Figure 11:
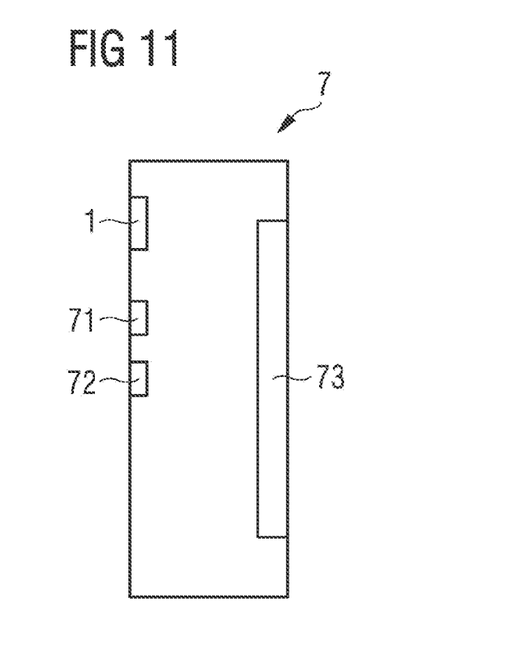
FIG. 11 shows a schematic cross section of an example of an image recording device with a semiconductor light source.

In FIG. 11 an example of a portable image recording device 7 is shown schematically. The image recording device 7 comprises a semiconductor light source 1, in particular as shown in connection with FIGS. 1A-1E or 6A-6D. Two camera sensors 71, 72 are also present. The camera sensors 71, 72 are set up for different distances of an object to be recorded from the image recording device 7. Depending on which camera sensor 71, 72 is used, the emission units 21, 22 are controlled accordingly to illuminate the desired target area appropriately. In addition, the image recording device 7 has a display 73.

The light sources described herein are not restricted to the examples by the description on the basis of said examples. Rather, this disclosure encompasses any new feature and also any combination of features that in particular comprises any combination of features in the appended claims and any combination of features in the examples, even if the feature or combination itself is not explicitly specified in the claims or examples.

This application claims priority of DE 10 2017 112 112.9, the subject matter of which is incorporated herein by reference.

The invention claimed is:

1. A semiconductor light source comprising:
   at least one first emission unit,
   at least one second emission unit, and
   an optics,
   wherein
   the optical system has an inner region that converges radiation from the first emission unit,
   the optical system has an outer region that expands radiation from the second emission unit,
   a first light emission region of the inner region completely covers the first emission unit when viewed in plan view, and at least partially covers the second emission unit,
   a second light emission region of the outer region is partially beside and overlaps with the second emission unit when viewed in plan view,
   the inner region and the outer region have differently shaped light entry regions,
   the outer region tapers when viewed along an optical axis of the optics in a direction away from the first emission unit,
   the second emission unit extends all around the first emission unit when viewed in plan view, and
   both emission units are configured to emit light of the same color locus.

2. The semiconductor light source according to claim 1, wherein the first light emission region and the second light emission region are separated from one another by a kink, viewed in cross section, and the light entry regions are separated from each other by a kink.

3. The semiconductor light source according to claim 1, wherein the first light entry region is planar in shape and oriented perpendicularly to an optical axis of the optical system.

4. The semiconductor light source according to claim 1, wherein the second light entry region of the outer region is prismatically shaped, viewed in cross section, so that the second light entry region is formed by a surface inclined towards the first emission unit so that the radiation of the second emission unit is refractively deflected away from the first emission unit.

5. The semiconductor light source according to claim 1, wherein the second light emission region, viewed in cross section, is formed as a triangle and tapers in the direction away from the second emission unit, and an interior side closer to the first emission unit is configured for total reflection and an exterior side of the second light emission region opposite the interior side is configured for refraction of the radiation of the second emission unit.

6. The semiconductor light source according to claim 5, wherein the triangle has a rounded tip, the light emission regions being flush with one another in the direction away from the emission units.

7. The semiconductor light source according to claim 1, wherein the optical system has a trapezoidal light input region seen in cross section, a bottom surface of the light input region forms said first light entry region, and side surfaces of the light input region are provided with a mirror configured to reflect the radiation of both the first and second emission units.

8. The semiconductor light source according to claim 7, wherein the second light emission region is formed by a dense arrangement of scattering lenses, the scattering lenses surrounding the first light emission region, which is in the form of a converging lens, all the way round when viewed in plan view.

9. The semiconductor light source according to claim 7, further comprising a reflector housing in which the first and second emission units and the light input region are located, wherein inner walls of the reflector housing are configured to reflect the radiation of the second emission unit.

10. The semiconductor light source according to claim 9, wherein the second light entry region extends completely and evenly between the inner walls and the mirror and is oriented perpendicularly to the optical axis of the optics.

11. The semiconductor light source according to claim 9, wherein, in cross section through an optical axis of the optical system
- a quotient of a width (B) of the emission units and a width (W) of a reflector base surface is 1 to 1.5,
- a quotient of the width (W) of the emission units and a height (H2) of the reflector housing is 2.9 to 3.5,
- a quotient of the width (W) of the emission units and a height (H3) of the first light emission region is 1.9 to 2.3, and
- a quotient of the width (W) of the emission units and a radius of curvature (R) of the first light emission region is 2 to 3.

12. The semiconductor light source according to claim 1, wherein the optical system is configured as a double optical system for two first and two second emission units so that the second light emission regions, viewed in plan view and taken together, are configured in a shape of a figure eight and separate and enclose the two first light emission regions from one another.

13. The semiconductor light source according to claim 1, wherein emission units that produce white light having a correlated color temperature of 2700 K to 4500 K and emission units that produce white light having a correlated color temperature of 5000 K to 8000 K are present, emission units of the same color temperature being assigned to one another, and the emission units being electrically operable independently of one another and being based on at least one light emitting diode chip.

14. The semiconductor light source according to claim 1, configured as a flashlight in a portable image recording device.

15. The semiconductor light source according to claim 1, wherein
- the outer region completely surrounds the inner region and the outer region and the inner region are each quadrant symmetrically configured,
- the second emission unit extends all around the first emission unit when viewed in plan view, and both emission units are configured to emit light of the same color locus, and
- the first light emission region is shaped as a converging lens.

16. The semiconductor light source according to claim 1, wherein an interior side of the outer region facing the first light emission region is further away from the first light emission unit than the light entry region of the inner region when viewed along the optical axis.

* * * * *